United States Patent
Nakata et al.

(10) Patent No.: US 8,513,735 B2
(45) Date of Patent: Aug. 20, 2013

(54) POWER SEMICONDUCTOR DEVICE

(75) Inventors: Shuhei Nakata, Tokyo (JP); Shoyu Watanabe, Tokyo (JP); Kenichi Otsuka, Tokyo (JP); Naruhisa Miura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 252 days.

(21) Appl. No.: 13/127,564

(22) PCT Filed: Jun. 30, 2009

(86) PCT No.: PCT/JP2009/061947
§ 371 (c)(1),
(2), (4) Date: May 4, 2011

(87) PCT Pub. No.: WO2010/073759
PCT Pub. Date: Jul. 1, 2010

(65) Prior Publication Data
US 2011/0210392 A1   Sep. 1, 2011

(30) Foreign Application Priority Data

Dec. 25, 2008 (JP) ................................. 2008-328884

(51) Int. Cl.
*H01L 29/78* (2006.01)
(52) U.S. Cl.
USPC ........... 257/341; 257/342; 257/335; 257/339; 257/331; 257/E29.255
(58) Field of Classification Search
USPC ........... 257/341, 342, 335, 339, 331, E29.255
See application file for complete search history.

(56) References Cited

U.S. PATENT DOCUMENTS

| | | |
|---|---|---|
| 5,169,793 A | 12/1992 | Okabe et al. |
| 5,313,088 A | 5/1994 | Takahashi et al. |
| 5,464,992 A | 11/1995 | Okabe et al. |
| 5,686,750 A | 11/1997 | Takahashi |

FOREIGN PATENT DOCUMENTS

| | | |
|---|---|---|
| JP | 4 229661 | 8/1992 |
| JP | 04-291768 | 10/1992 |
| JP | 4 346477 | 12/1992 |
| JP | 4 363068 | 12/1992 |
| JP | 5-167070 | 7/1993 |
| JP | 5 198816 | 8/1993 |
| JP | 9 252118 | 9/1997 |
| JP | 2003-115590 | 4/2003 |
| JP | 2004 349384 | 12/2004 |

OTHER PUBLICATIONS

Office Action issued Aug. 27, 2012, in Korean Patent Application No. 10-2011-7014456 with Partial English translation and Japanese translation.
U.S. Appl. No. 13/319,742, filed Nov. 10, 2011, Watanabe, et al.
International Search Report issued Sep. 1, 2009 in PCT/JP09/61947 filed Jun. 30, 2009.
Office Action issued Jun. 4, 2013, in Japanese Patent Application No. 2010-543942, (with English-language partial translation), 6 pages.

*Primary Examiner* — Cuong Q Nguyen
(74) *Attorney, Agent, or Firm* — Oblon, Spivak, McClelland, Maier & Neustadt, L.L.P.

(57) ABSTRACT

A structure of a power semiconductor device, in which a P-well region having a large area and a gate electrode are opposed to each other through a field oxide film having a larger thickness than that of a gate insulating film such that the P-well region having a large area and the gate electrode are not opposed to each other through the gate insulating film, or the gate electrode is not provided above the gate insulating film that includes the P-well region having a large area therebelow.

10 Claims, 16 Drawing Sheets

F I G . 1
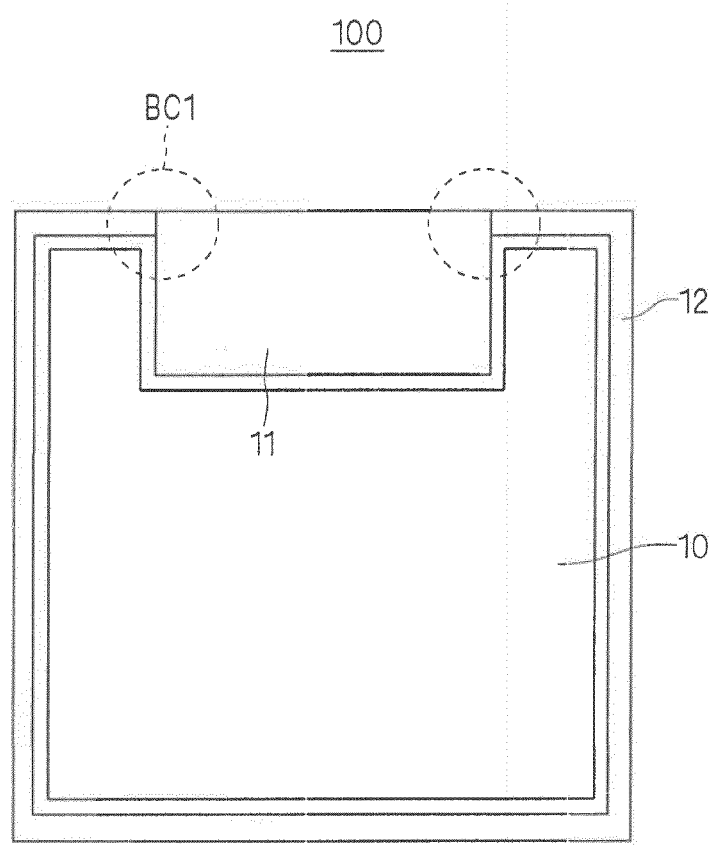

F I G . 4
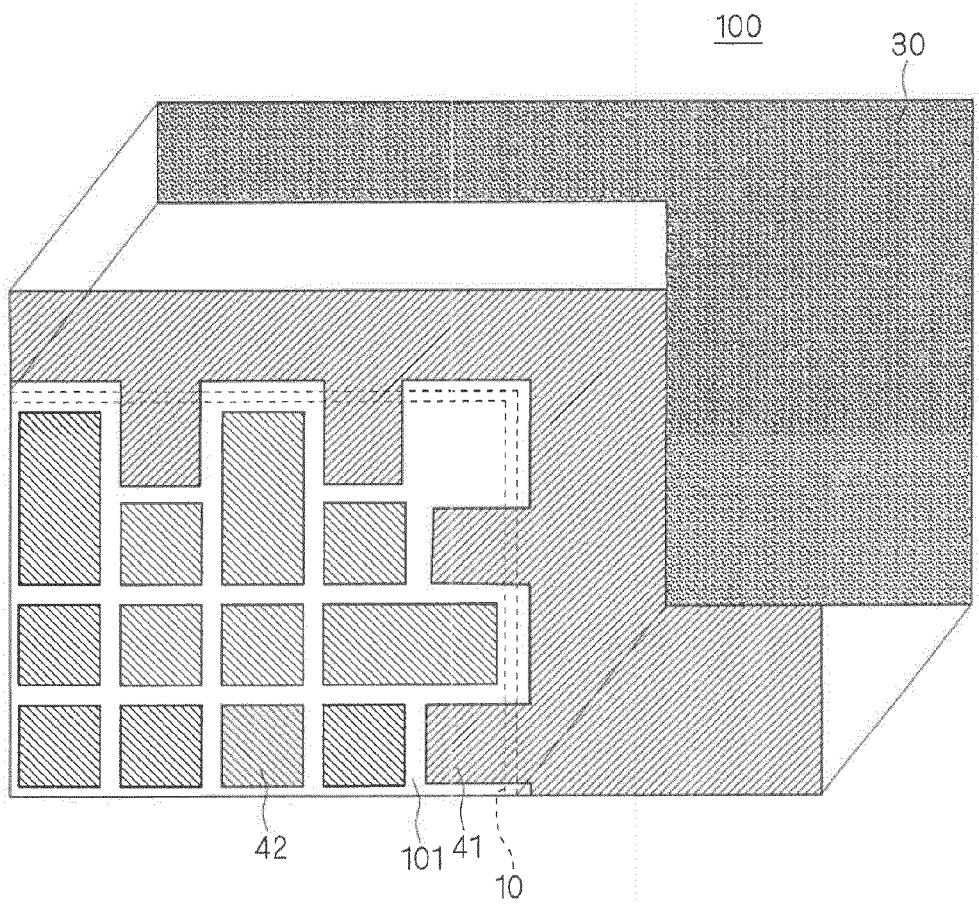

F I G . 5
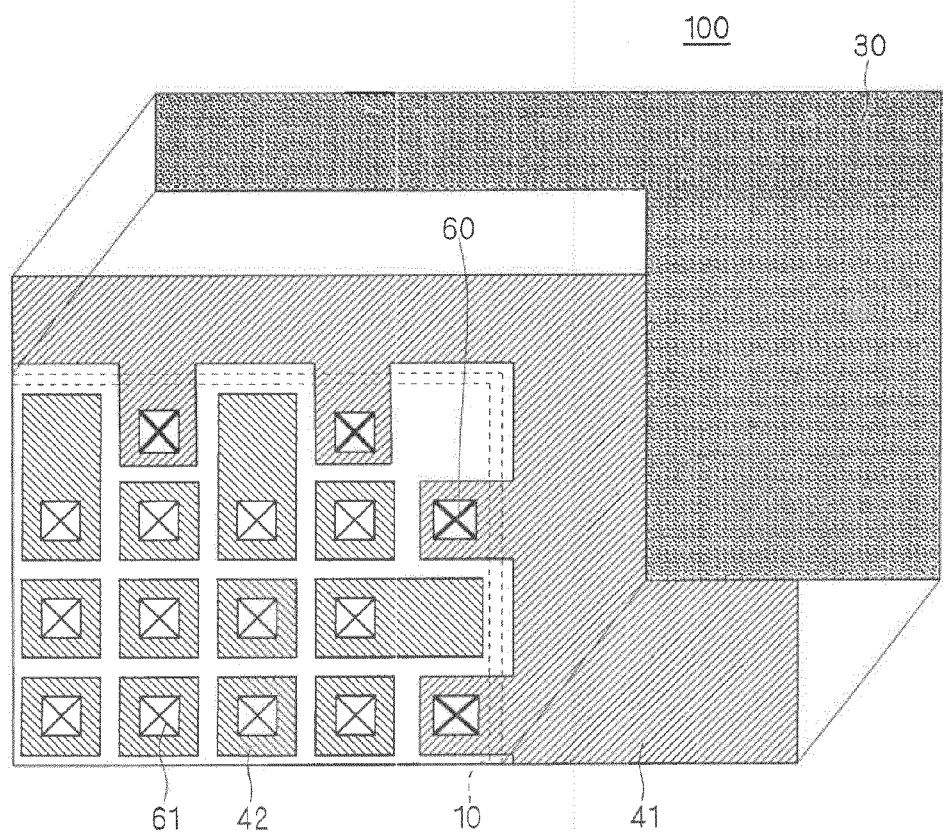

F I G . 8
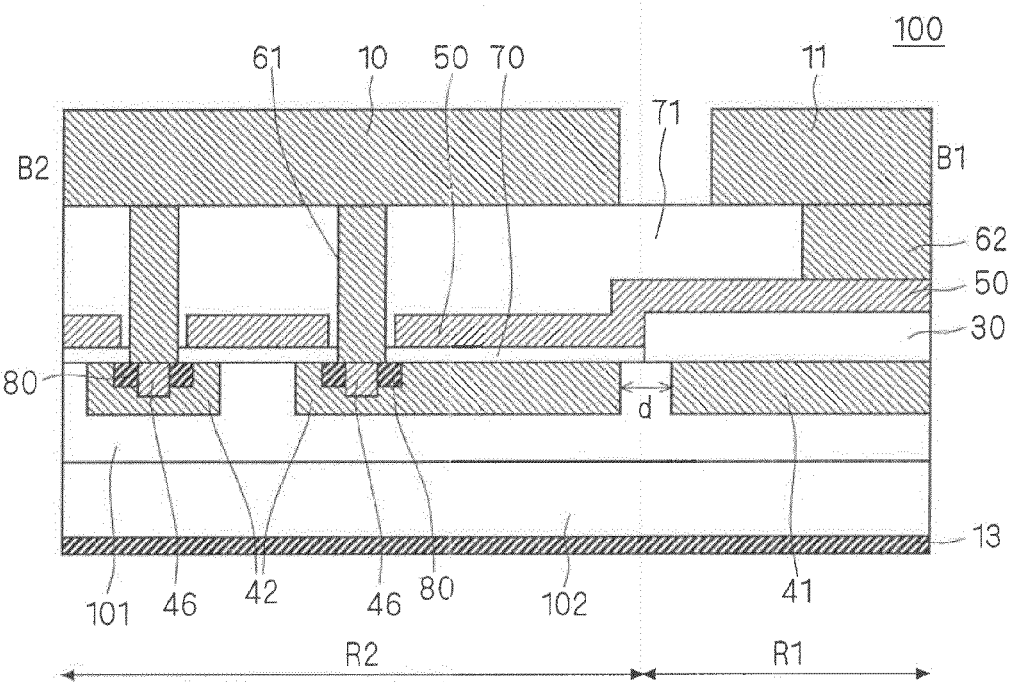

F I G . 1 2
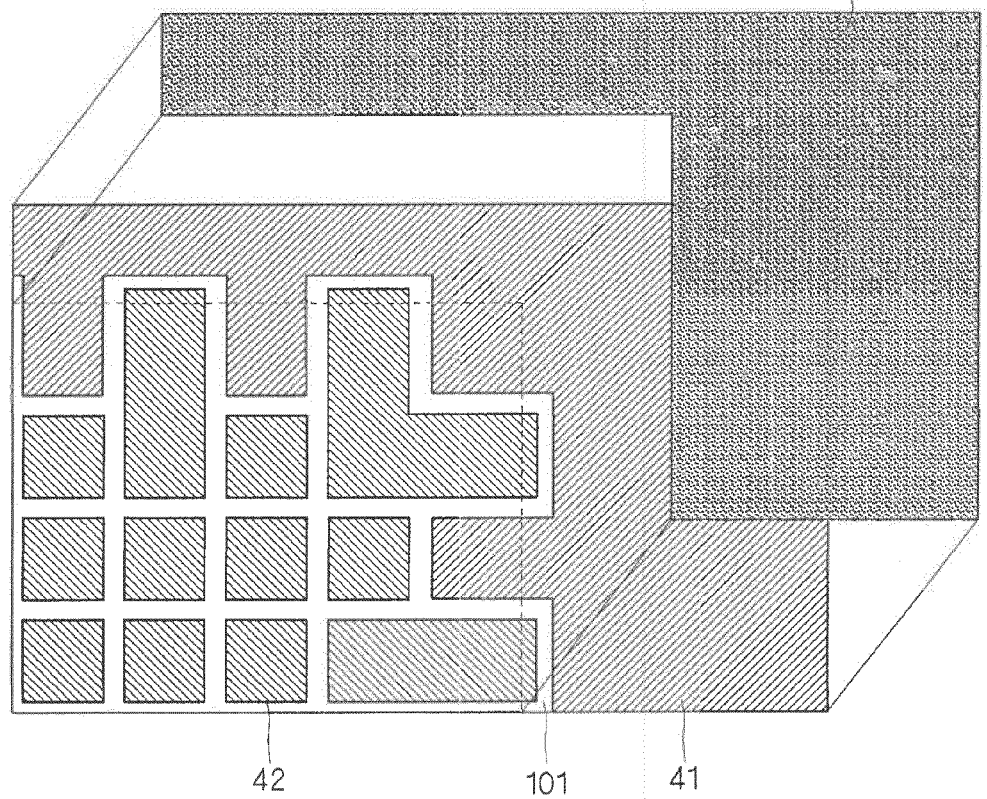

F I G . 1 3
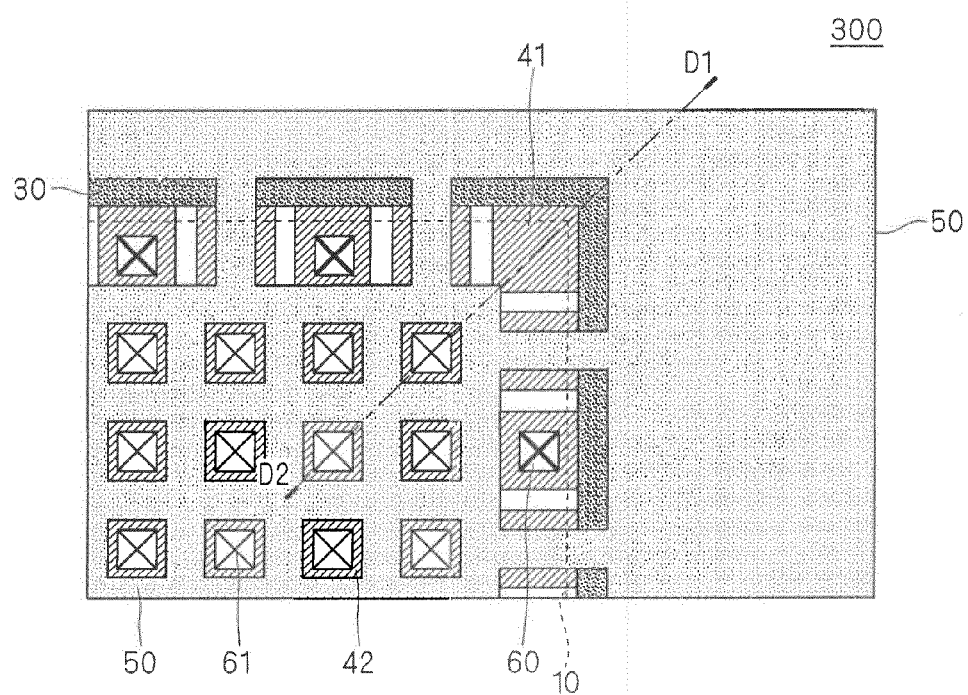
F I G . 1 4
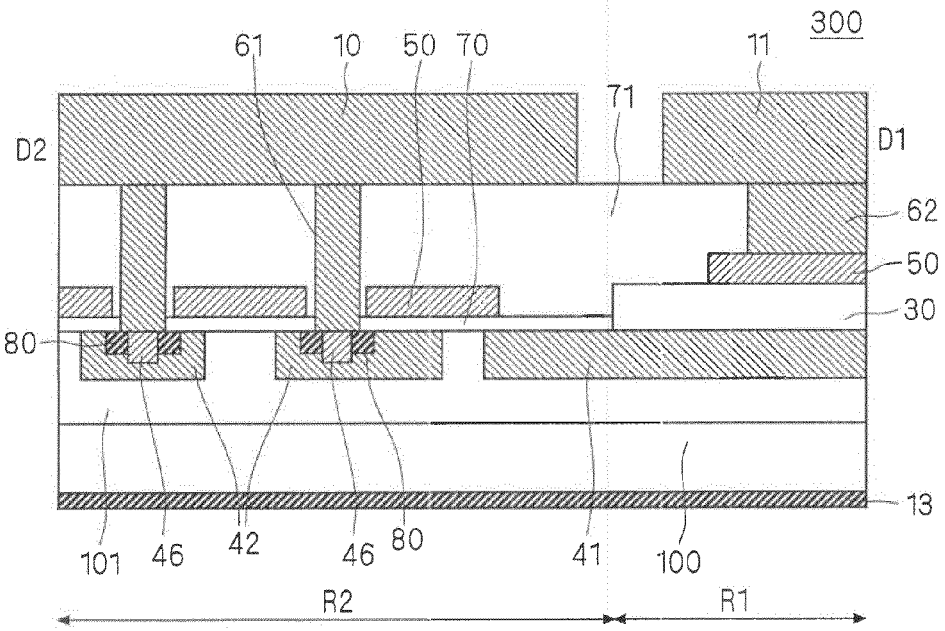

F I G . 2 1
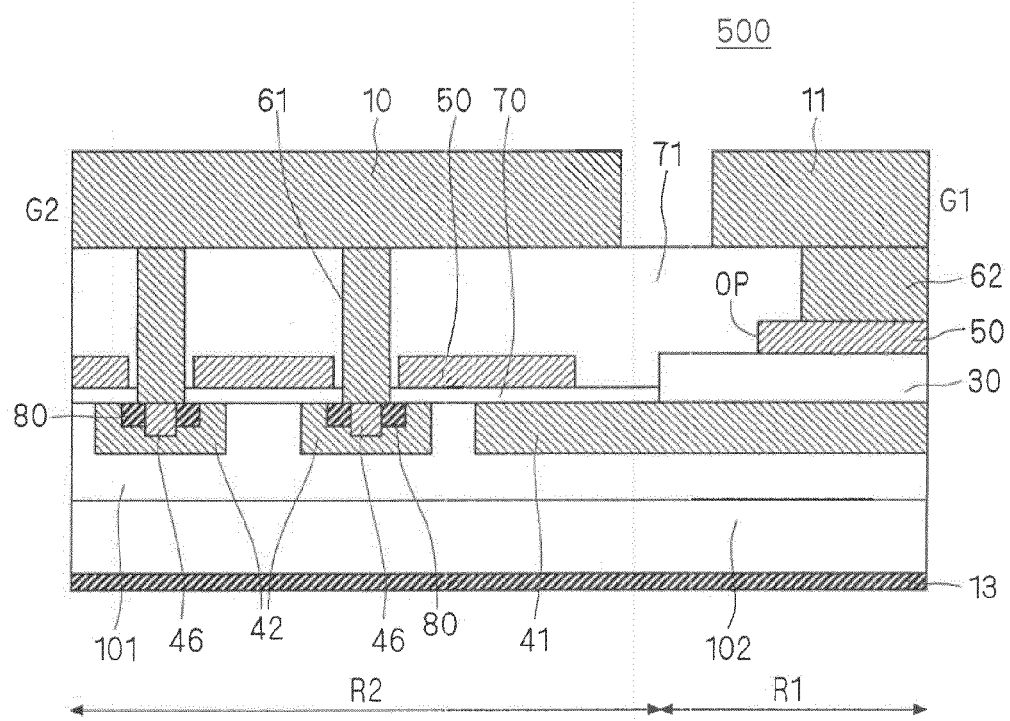

POWER SEMICONDUCTOR DEVICE

TECHNICAL FIELD

The present invention relates to the structure of a power semiconductor device.

BACKGROUND ART

In a vertical power MOS field effect transistor (MOSFET) described in Patent Document 1, as shown in FIG. 1 and FIG. 2 of this document, minute diodes are arranged at least in one line in a region on a cell region side of the MOSFET that is adjacent to a perimeter (including a gate pad portion) of the cell region of the MOSFET, along the perimeter. When the MOSFET is switched from an ON state to an OFF state, each of the above-mentioned diodes arranged in a line in the region between the gate pad portion and the cell region of the MOSFET absorbs holes injected, in forward bias, into an N-type semiconductor layer on the drain side from the P-well and P-base shown in FIG. 2 of Patent Document 1. Accordingly, with the structure of Patent Document 1, a parasitic transistor shown in FIG. 3 of this document is prevented from turning on when the MOSFET is switched from forward bias to reverse bias.

In the structure of Patent Document 1, as shown in FIG. 2 thereof, the P-base that is the P-well of the MOSFET is electrically connected to the source electrode through a back gate.

PRIOR ART DOCUMENT

Patent Document

Patent Document 1: Japanese Patent Application Laid-Open. No. 05-198816 (FIG. 1 to FIG. 3)

SUMMARY OF THE INVENTION

Problems to be Solved by the Invention

Problems to be solved by the present invention will be described below with reference to FIG. 2 of Patent Document 1.

In a case where a MOSFET cell that is a switching element switches from an ON state to an OFF state, the drain voltage of the MOSFET cell, that is, the voltage of the drain electrode rises sharply, which changes from approximately 0 V to several hundreds V. As a result, a displacement current flows into the P-well through the parasitic capacitance occurring across the P-well and the N$^-$-drain layer. This displacement current flows to the source electrode as described below, which holds true for the P-well of the MOSFET cell, P-well of the diode cell, and the P-well below the gate pad.

The point to note here is that the area of the P-well below the gate pad is much larger than the areas of the P-well of the MOSFET cell and the P-well of the diode cell.

In Patent Document 1, the source electrode is electrically connected to the field plate as described in the description of the background art thereof. Therefore, with reference to the cross section shown in, for example, Part (C) of FIG. 2, the displacement current flowing into the P-well below the gate pad flows through the P-well below the gate pad from the cell direction of the MOSFET toward the contact hole connected to the field plate, and then flows into the source electrode through the field plate.

As described above, though the area of the P-well below the gate pad is extremely large, there exists a resistance in the P-well itself and the contact hole. Therefore, when a displacement current flows through the P-well having a large area, a voltage drop occurs by a nonnegligible value in the P-well. This results in a relatively large potential in a location of the P-well with a large distance in a horizontal direction from a location (contact hole) that is electrically connected to the source electrode through the field plate. Note that this potential increases as the variation dV/dt of the drain voltage V to the time t becomes larger.

As a result, when the gate electrode is provided in the location of the P-well below the gate pad, which is apart from the contact hole, through the gate insulating film as shown in Part (C) of FIG. 2 of Patent Document 1, in some cases, a large electric field is applied to the gate insulating film between the gate electrode having a voltage close to 0 V immediately after the MOSFET cell is switched from the ON state to the OFF state and the P-well below the gate pad in the location apart from the contact hole, leading to dielectric breakdown in the gate insulating film.

Nowadays, a switching element in which silicon carbide (SiC) is used as a substrate material is expected as a switching element that consumes low power. It is expected to reduce loss of an, inverter by application of the SiC device as described above, for example, a MOSFET or an insulated gate bipolar transistor (IGBT) as the switching element of the inverter.

In order to achieve further loss reduction, a switching element is required to be driven at much higher speed (much larger variation dV/dt of drain voltage V to time t). Unfortunately, in the switching element in which SiC is used as a substrate material, the bandgap of the SiC material is larger compared with a switching element in which silicon conventionally used in a wide range is used for a material, which makes it difficult to sufficiently reduce the resistance of the semiconductor layer. As a result, the parasitic resistance tends to be large, and the large parasitic resistance increases the potential generated in the P-well in some cases.

The present invention has been made in view of findings of the above-mentioned problems and the recognition of the locations where the above-mentioned problems occur, and a main object thereof is to enable the prevention of the dielectric breakdown occurring across a gate electrode and a source electrode in switching (turn-off), in a semiconductor device including a switching element having a MOS structure.

Means to Solve the Problems

A subject matter of the present invention is a power semiconductor device including: a first-conductivity-type semiconductor substrate including a first main surface and a second main surface opposed to each other; a second-conductivity-type first well region located in a part of a surface of the first main surface of the first-conductivity-type semiconductor substrate; a second-conductivity-type second well region located in a part of the surface of the first main surface of the first-conductivity-type semiconductor substrate and having a smaller area compared with the first well region when viewed from an upper surface; a gate insulating film located on a surface of the second well region; a field oxide film located on a surface of the first well region and having a larger film thickness compared with the gate insulating film; a source electrode electrically connecting the first well region and the second well region; a gate electrode located on the gate insulating film and the field oxide film so as to be in contact therewith in a continuous manner; a gate pad located above the first well region and electrically connected to the gate electrode; and a drain electrode located on the second main surface of the semiconductor substrate, in which an outer boundary of the first well region is located inside an outer perimeter of the field oxide film in a vicinity of a bonding portion between the gate insulating film and the field oxide film in all locations in which the gate electrode located on an upper surface of the field oxide film while being in contact with the field oxide film extends beyond the field oxide film.

Effects of the Invention

According to the subject matter of the present invention, an electrical field of large strength is prevented from being applied to the gate insulating film to inhibit the dielectric breakdown of the gate insulating film even in a case where a power semiconductor device is driven at high speed, which results in a higher-speed switching operation.

BRIEF DESCRIPTION OF DRAWINGS

FIG. 1 is a top view of power semiconductor devices according to first to fifth embodiments.

FIG. 4 is a plan view of the power semiconductor device according to the first embodiment.

FIG. 5 is a plan view of the power semiconductor device according to the first embodiment.

FIG. 8 is a vertical cross-sectional view of the power semiconductor device, which is taken along a line B1-B2 of FIG. 6.

FIG. 12 is a plan view of the power semiconductor device according to the third embodiment.

FIG. 13 is a plan view of the power semiconductor device according to the third embodiment.

FIG. 14 is a vertical cross-sectional view of the power semiconductor device, which is taken along a line D1-D2 of FIG. 13.

FIG. 21 is a vertical cross-sectional view of the power semiconductor device, which is taken along a line G1-G2 of FIG. 18.

EMBODIMENTS FOR CARRYING OUT THE INVENTION

Figure 2:
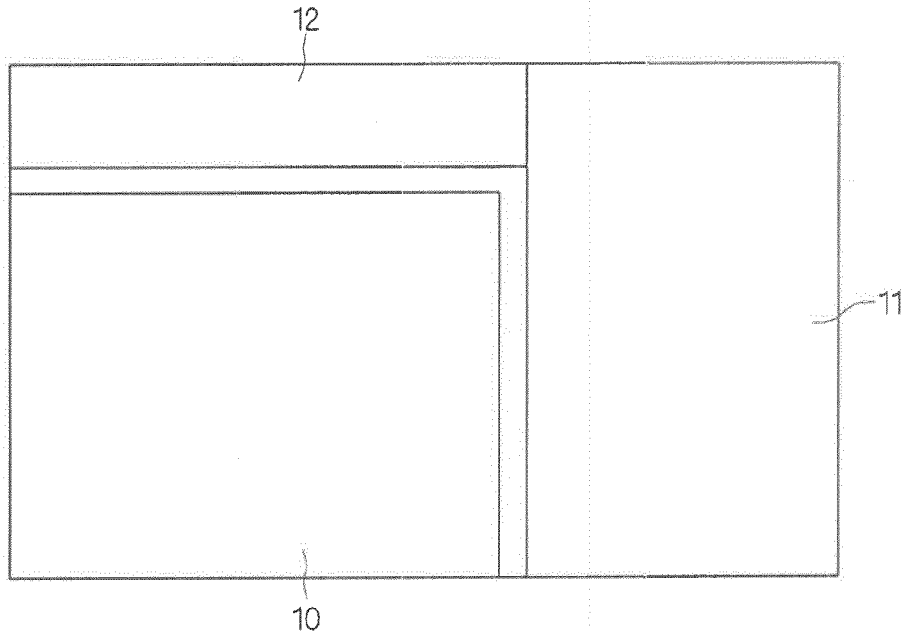
FIG. 2 is a top view showing a region in the vicinity of a gate pad of the power semiconductor devices according to the first to fifth embodiments in an enlarged manner.

In the description below, as to the conductivity types of impurities, an N-type and a P-type are generally defined as the "first conductivity type" and "second conductivity type", respectively, which may be defined in an opposite manner.

First Embodiment

FIG. 1 is a plan view schematically showing the configuration of the upper surface of a power semiconductor device 100 according to the present embodiment. Note that FIG. 1 is used also in a second embodiment described below.

With reference to the plan view shown in FIG. 1, formed in the center portion of the upper end is a gate pad 11 to which a gate voltage is applied by an external control circuit (not shown). In addition, a source electrode 10 connected to respective MOSFET cells is formed in a cell region that is a cluster region of the MOSFET cells.

Further, a gate finger electrode 12 that entirely surrounds the perimeter of the source electrode 10 is formed along the edge of the power semiconductor device 100 in a state of being structurally connected to the gate pad 11. That is, the gate finger electrode 12 is disposed around the perimeter of an interlayer insulating film 71 described below (see FIG. 7). The gate voltage applied to the gate pad 11 is supplied to a gate electrode (not shown) of each MOSFET cell through the gate pad 11 and the gate finger electrode 12. It is assumed in the present embodiment that each gate electrode is formed of polysilicon, as an example.

Polysilicon has a drawback of conductivity, and thus a time lag occurs between the potential of the gate pad 11 and the potential of the gate electrode of the MOSFET cell if the gate electrode becomes farther apart from the gate pad 11. The time lag is determined by the time constant of the resistance of a polysilicon layer and the parasitic capacitance determined by the source electrode 10 and a gate extraction wiring layer. In the present embodiment, a potential is easily supplied to the gate electrode of each cell of the MOSFET by forming the gate finger electrode 12 that is a metal film made of a low-resistance material (for example, aluminum (Al)) along the edge of the power semiconductor device 100, thereby increasing the speed of switching.

In power semiconductors devices as products, though electrodes for temperature sensor and current sensor are formed in many cases, the presence/absence of those electrodes does not affect the effects of the power semiconductor device 100 described below, which is not described nor shown.

In addition, though the position and number of the gate pads 11 and the shape and the like of the source electrode 10 might vary depending on a MOSFET, which do not affect the effects of the power semiconductor device 100 described below, similarly to the electrode for current sensor and the like.

FIG. 2 is a plan view showing the region indicated by a broken line BC1 on the left of FIG. 1, that is, the perimeter of the gate pad 11, from which the gate finger electrode 12 projects, and the region in the vicinity thereof in an enlarged manner, which shows a part of the gate pad 11, a part of the gate finger 12 and a part of the source electrode 10.

Figure 3:
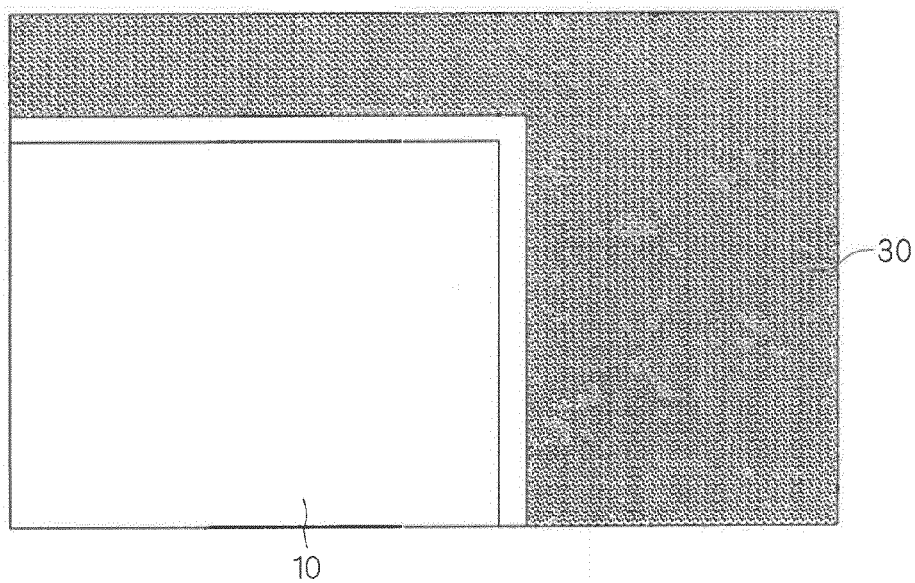
FIG. 3 is a plan view of the power semiconductor device according to the first embodiment.

FIG. 3 is a plan view showing a field oxide region located as a lower layer part of the gate pad 11 and the gate finger electrode 12 in the part shown in FIG. 2. With reference to FIG. 3, in the field oxide region, a field oxide film 30 is formed so as to be in contact with a SiC semiconductor layer, which is a metal layer, below the gate pad 11 and the gate finger electrode 12.

FIG. 4 shows the state in which the gate pad 11 and the gate finger electrode 12 are omitted from the part shown in FIG. 2 and FIG. 3 and the field oxide film 30 that is the layer below the source electrode 10, the gate pad 11 and the finger electrode 12 is moved obliquely upward.

As shown in FIG. 4, a P-type first well region 41 is formed within the surface of the SIC semiconductor layer 101 that is located in the part as the lower layer of the field oxide film 30, and a plurality of second well regions 42 are formed within the surface of the SiC semiconductor layer 101 so as to correspond to the respective cells of the MOSFET.

With reference to FIG. 4, parts of the first well region 41 extend beyond the formation region of the field oxide film 30 so as to project therefrom, parts of the second well regions 42 in proximity to the formation region of the field oxide film 30 extend so as to be sandwiched by the projections of the first well region 41, and the projections of the first well region 41 and the second well regions 42 are alternately provided in the vicinity of the field oxide film 30.

FIG. 5 is a plan view showing well contact holes 60 and source contact holes 61 that penetrate through a gate insulating film (not shown) and an interlayer insulating film (not shown) that are provided above the first well region 41 and the second well regions 42 shown in FIG. 4 and reach the first well region 41 and the second well regions 42, respectively.

Though not shown, the well contact holes 60 are formed so as to be in contact with the P-contact region which will be described below in detail after being provided within the surface of the first well region 41, while the source contact holes 61 are formed so as to be in contact with the P-type contact region, which will be described below in detail after being provided on the surfaces of the second well regions 42 and the N-type source region provided therearound.

The source contact holes 61 and the well contact holes 60 are connected in common to the source electrode 10 provided thereabove, whereby a substantially identical potential is obtained in a SiC region with which the source contact holes 61 and the well contact holes 60 are in contact.

Figure 6:
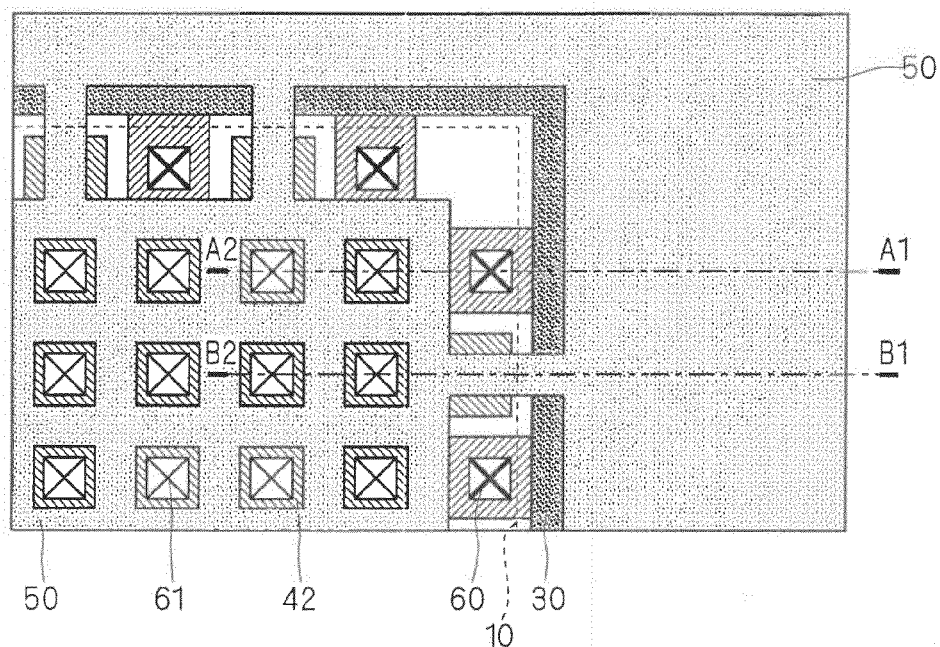
FIG. 6 is a plan view of the power semiconductor device according to the first embodiment.

FIG. 6 is a plan view showing a gate electrode 50 provided above the first well region 41 and the second well regions 42 shown in FIG. 4. With reference to FIG. 6, the gate electrode 50 is provided so as to be located within the formation region of the field oxide film 30 in the region that is the lower portions of the gate pad 11 (FIG. 2) and the gate finger electrode 12 (FIG. 2), and is provided so as to surround the outer perimeter of each source contact hole 61 in the formation region of the MOSFET cell below the source electrode 10. The portion of the gate electrode 50 below the gate pad 11 (FIG. 2) and the gate finger electrode 12 (FIG. 2) and the portion of the gate electrode 50 below the source electrode 10 are configured to be connected to each other through the region in which the well contact hole 60 is not provided.

Though not shown, the gate electrode 50 below the gate pad 11 and the finger electrode 12 is electrically connected to the gate pad 11 and the gate finger electrode 12 through gate contact holes provided in an interlayer insulating film described below.

In FIG. 6, a line A1-A2 indicates the cut line which passes through the well contact hole 60, and a line B1-B2 indicates the cut line which does not pass through the well contact hole 60, both of which showing the cross-sections including the gate electrode 50 below the gate pad 11 (FIG. 2) and the gate finger electrode 12 (FIG. 2) and the gate electrode 50 below the source electrode 10.

Figure 7:
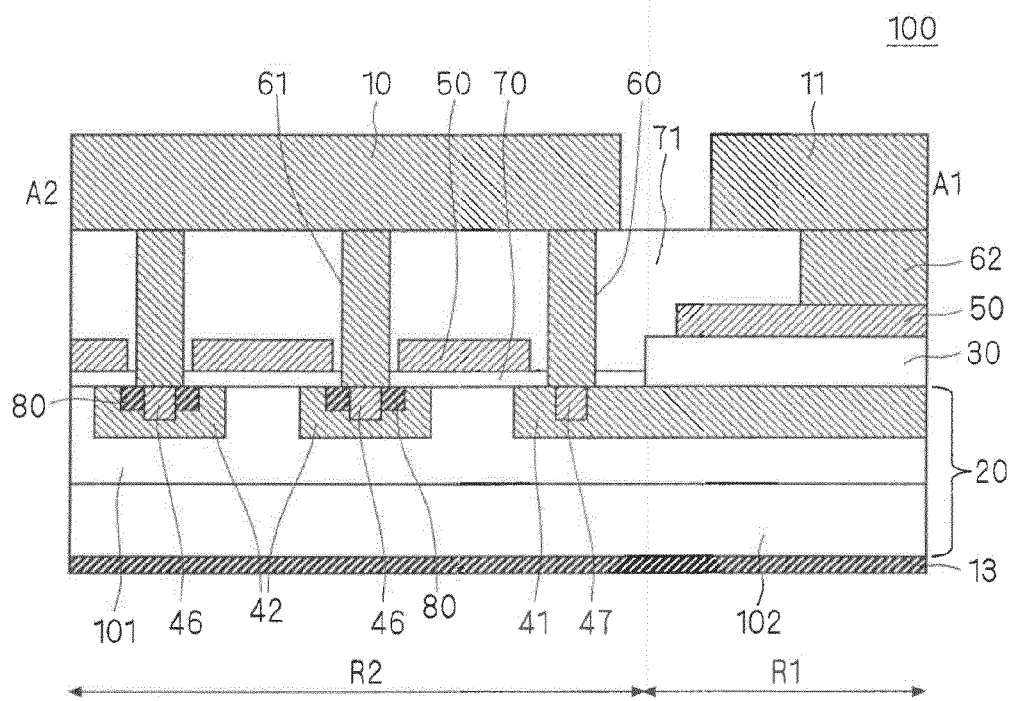
FIG. 7 is a vertical cross-sectional view of the power semiconductor device, which is taken along a line A1-A2 of FIG. 6.

FIG. 7 is a vertical cross-sectional view taken along the line A1-A2 of FIG. 6, and FIG. 8 is a vertical cross-sectional view taken along the line B1-B2 of FIG. 6. As shown in FIG. 7 and FIG. 8, the power semiconductor device 100 is configured to include a so-called vertical MOSFET and diodes connected in parallel thereto.

As shown in FIG. 7 and FIG. 8, the power semiconductor device 100 is formed on a semiconductor substrate 20 made of SiC, and the semiconductor substrate 20 includes an $N^+$ drain layer 102 and the $N^-$ drain layer 101 that is an epitaxial layer formed thereon. Further, formed on a second main surface that is the back surface of the semiconductor substrate 20 is a drain electrode 13 being a first electrode.

While, the first well region 41 and the second well regions 42 that are formed by doping P-type impurities are provided from a first main surface that is the front surface of the semiconductor substrate 20 toward the inside of the $N^-$ drain layer 101. Here, the bottom surfaces of the first well region 41 and the second well regions 42 are located at positions shallower than the bottom surface of the $N^-$ drain layer 101 when viewed from the first main surface.

Hereinafter, the structure shown in FIG. 7 will be first described, and then, a difference between the structure of FIG. 7 and the structure of FIG. 8 will be described.

The first well region 41 is disposed in regions directly below the gate pad 11 and the gate finger electrode 12 described with reference to FIG. 1 and the like and the regions in the vicinity thereof. Here, the region in which the field oxide film 30 is disposed is referred to as a first region R1. The first region R1 is a region that does not basically include cells of a MOSFET.

The field oxide film 30 disposed above the first well region 41 has a thickness of, for example, approximately 1 µm.

In FIG. 7, a region other than the first region R1 is referred to as a second region R2. In the second region R2, as shown in FIG. 7, a gate insulating film 70 having a thickness of, for example, approximately 50 nm is formed on parts of the surfaces of the second well regions 42 and the $N^-$ drain layer 101. Here, the field oxide film 30 and the gate insulating film 70 are mainly made of $SiO_2$.

Further, as show in FIG. 7, in the first region R1, the gate electrode 50 of, for example, polysilicon is provided only on the upper surface of the field oxide film 30. Note that the gate electrode 50 is provided so as to be located within the formation region of the field oxide film 30.

Further, an interlayer insulating film 71 is disposed so as to cover the upper surface and end surface of the gate electrode 50, and a gate contact hole 62 is provided so as to penetrate through the interlayer insulating film 71, whereby the gate electrode 50 is electrically connected to the gate pad 11 and the gate finger electrode 12 (FIG. 2) through the gate contact hole 62.

The gate insulating film 70 is formed on the surfaces of the projections of the first well region 41 that extend beyond the first region R1 and the second well regions 42 provided in the second region R2 and the surface of the $N^-$ drain layer 101, and the well contact hole 60 provided so as to penetrate through the interlayer insulating film 71 and the gate insulating film 70 and be in contact with the first well region 41 is configured to be also in contact with a P-type contact region 47 that is provided in the surface portion of the first well region 41 and contains high-concentration P-type impurities.

Further, a source region 80 having high-concentration N-type impurities (N+) on the surface side of the center portion is provided in each of the plurality of second well regions 42 provided in the second region R2, and a P-type contact region 46 having P-type impurities is provided in the center portion of the source region 80 so as to penetrate through the source region 80, where the source region 80 is configured to surround the P-type contact region 46 in plan view.

Further, the source contact hole 61 is provided, which penetrates through the gate insulating film 70 being in contact with the upper portions of the source region 80 and the P-type contact region 46 and the interlayer insulating film 71 and is in contact with the source region 80 and the P-type contact region 46.

The gate electrode 50 is formed on the gate insulating film 70 between the adjacent source contact holes 61, and the interlayer insulating film 71 is disposed so as to cover the upper surface and end surface of the gate electrode 50.

Further, the source contact holes 61 and the well contact hole 60 are electrically connected in common to the source electrode 10 formed thereon so that the bottoms of the source contact holes 61 and the well contact hole 60 are electrically connected to each other.

Next, though the structure of FIG. 8 corresponding to the vertical cross-sectional view taken along the line B1-B2 of FIG. 6 will be described, the structure of FIG. 8 has the structure similar to the structure of FIG. 7 in many respects, and thus differences between FIG. 7 and FIG. 8 will be particularly described below.

First, a first difference (1) between the structure of FIG. 8 and the structure of FIG. 7 is that the well contact hole 60 that electrically connects the first well region 41 and the source electrode 10 is not provided in the structure of FIG. 8.

A second difference (2) is that in FIG. 8, the gate electrode 50 on the upper surface of the field oxide film 30 extends from the first region R1 side toward the second region R2 side which corresponds to the cell region to be integrated with the gate electrode 50 of each MOSFET cell in the second region R2.

The above-mentioned second difference (2) results in a third difference (3) that a P-type well region (region such as the first well region 41 or second well region 42) is not located directly below the end of the field oxide film 30 in the cross sectional direction, but the N− drain layer 101 is located therebelow.

In other words, in the cross section of FIG. 8, the first well region 41 and the second well region 42 are opposed to each other with a part of the N− drain layer 101 being sandwiched therebetween in a plan view direction, and the distance therebetween is d (≠0). A boundary surface between the end of the gate insulating film 70 and the end of the field oxide film 30 is located directly above the sandwiched N− drain layer 101.

Here, an excessively large value of the distance d leads to the application of drain voltage directly to the gate insulating film 70, which might incur dielectric breakdown in the gate insulating film 70. For this reason, the distance d is set approximately to the intervals between the second well regions 42 in the cell region of the MOSFET.

Next, the method of manufacturing a cell of the vertical MOSFET according to the present embodiment will be described with reference to FIG. 7.

First, the semiconductor substrate 20 made of SiC containing N-type impurities is prepared. The semiconductor substrate 20 may be inclined 8° or smaller with respect to the c-axis direction, or does not need to be inclined. The effects of the present embodiment are not affected even if the semiconductor substrate 20 has any plane direction.

The semiconductor substrate 20 includes the N− drain layer 101 formed of an epitaxial crystal grown layer (having impurity concentration within the range of $1\times10^{13}$ cm$^{-3}$ to $1\times10^{17}$ cm$^{-3}$ and thickness of 5 μm to 200 μm) on the N+ drain layer 102.

After that, impurities are ion-planted with the use of a resist mask and an oxide film mask processed by photolithography, to thereby form the P-type first well region 41, P-type second well regions 42 and N+ source region 80.

As impurities to be injected, nitrogen or phosphorus is preferred in the case where the conductivity type is N-type, whereas aluminum or boron is preferred in the case where the conductivity type is P-type.

The depths of the first well region 41 and the second well region 42 are individually set so as not to exceed the bottom surface of the N− drain layer 101 that is an epitaxial crystal grown layer and, for example, is set to a value within the range of 0.3 μm to 2.0 μm. Further, impurity concentrations of the first well region 41 and the second well region 42 individually exceed the impurity concentration of the N− drain layer 101 that is an epitaxial crystal grown layer and is set in the range of $1\times10^{16}$ cm$^{-3}$ to $1\times10^{19}$ cm$^{-3}$.

Moreover, the depth of the N+ source region 80 is set such that the bottom surface thereof does not exceed the bottom surface of the second well region 42, and a value of its impurity concentration exceeds a value of the impurity concentration of the second well region 42. In addition, the value thereof is set to be a value within the range of $1\times10^{18}$ cm$^{-3}$ to $1\times10^{21}$ cm$^{-3}$.

Then, in order to achieve excellent metallic contact between the source electrode 10 and each of the second well region 42 and the first well region 41, the P-type contact regions 46 and 47 that have values of higher impurity concentrations than the impurity concentrations of the first well region 41 and the second well regions 42 are formed in the first well region 41 and the second well region 42, respectively, by ion implantation. Note that ion implantation is performed at the substrate temperature equal to or higher than 200° C.

After that, heat treatment is performed for a period of time within the range of 0.5 minutes to 60 minutes at a temperature within a range of 1,500° C. to 2,200° C. in an inert gas atmosphere such as argon or nitrogen or in a vacuum, to thereby electrically activate the implanted impurities.

Next, a clean surface is obtained after removing a surface modified layer by the formation of an oxide film through sacrificial oxidation and removal of the oxide film using hydrofluoric acid, and then, only the cell region is made open, to thereby perform patterning of the field oxide film 30 that covers the region other than the cell region with a silicon oxide film. After that, the gate insulating film 70 is formed by, for example, thermal oxidation or deposition.

Then, the gate electrode 50 is patterned through photolithography and dry etching.

Next, the interlayer insulating film 71 is deposited on the entire surface of the substrate by the CVD process, and then, the well contact hole 60, the source contact hole 61 and the gate contact hole 62 are made open by, for example, dry etching. Thereafter, those openings are filled with a conductive material in the course of forming the source electrode 10.

Subsequently, wiring metal such as Al is formed by sputtering or deposition, and then is subjected to patterning, to thereby form the gate pad 11, the gate finger electrode 12 and the source electrode 10. Further, a metal film is formed on the back surface of the semiconductor substrate 20 to form the drain electrode 13, with the result that the vertical MOSFET shown in FIG. 7 and the like is completed.

Next, effects of the present embodiment will be described. First, in the power semiconductor device according to the present embodiment, a plurality of MOSFET cells and diodes are electrically connected in parallel to each other, the source electrode 10 of the MOSEFET is connected to the p-electrode (anode) of the diode, and the drain electrode 13 of the MOSFET is integrated with the n-electrode (cathode) of the diode.

In a case where the voltage to be applied to the gate pad 11 and the gate finger electrode 12 that are connected to the gate electrode 50 of the MOSFET is applied such that the MOSFET cells are switched from the ON state to the OFF state, the drain voltage of the MOSFET cell, that is, the voltage of the drain electrode rises sharply and changes from approximately 0 V to several hundreds V. As a result, the displacement current flows into the first well region 41 and the second well region 42 through the parasitic capacitance existing across the N⁻ drain layer 101, and the P-type first well region 41 and second well region 42.

The second well region 42 does not have a large area, and thus the parasitic resistance therein is small, where the potential of the second well region 42 does not rise to a large extent even when a somewhat large displacement current flows. While, the first well region 41 has a large area, and thus a large potential is generated due to the parasitic resistance and displacement current of the first well region 41 before the displacement current, which has been generated in the location far from the p-contact (well contact hole 60) of the diode connected to the outside, flows into the well contact hole 60. However, the gate electrode 50 is removed from the position at which the gate electrode 50 is opposed to the first well region 41 through the gate insulating film 70, which reduces the possibility that the dielectric breakdown of the gate insulating film 70 may occur.

That is, in the present embodiment, differently from the case of Patent Document 1, the gate electrode 50 is not located above the end of the field oxide film 30 in the part indicated by the line A1-A2 of FIG. 6, as shown in FIG. 7. Therefore, a high electric filed is not generated at the end of the gate insulating film 70, which does not lead to poor insulation at the end of the gate insulating film 70.

On the other hand, as shown in FIG. 8, in the part indicated by the line B1-B2 of FIG. 6, the gate electrode 50 is located beyond the end of the field oxide film 30, but the P-type first well region 41 and second well region 42 are not located in the N⁻ drain layer 101 directly below the boundary surface of the bonding portion between the end of the gate insulating film 70 and the end of the field oxide film 30. That is, the outer perimeter boundary of the first well region 41 is provided inside the outer perimeter of the field oxide film 30 in the vicinity of the bonding portion. Accordingly, a high electric field is not generated at the end of the gate insulating film 70, which does not lead to poor insulation at the end of the gate insulating film 70. Therefore, in the cross-sectional configuration (FIG. 7) taken along the line A1-A2 of FIG. 6, the leakage current between the gate electrode 50 and the source electrode 10 through the end of the gate insulating film 70 is prevented from occurring significantly.

The effects described in the present embodiment are achieved with the structure of the power semiconductor device 100 according to the present embodiment, and hence the effects are not affected by the manufacturing method for forming the structure. Therefore, even if the device is manufactured by the manufacturing method other than the manufacturing method described as an example in the present embodiment, the effects described above are not affected. In addition, the constituent material will not affect a degree of the effects.

Second Embodiment

The second embodiment of the present invention corresponds to a modified example of the first embodiment, which is characterized in that the configuration of the corner portion of FIG. 4 is changed. Hereinafter, the characteristics of a power semiconductor device 200 according to the present embodiment will be described with reference to the figures.

Figure 9:
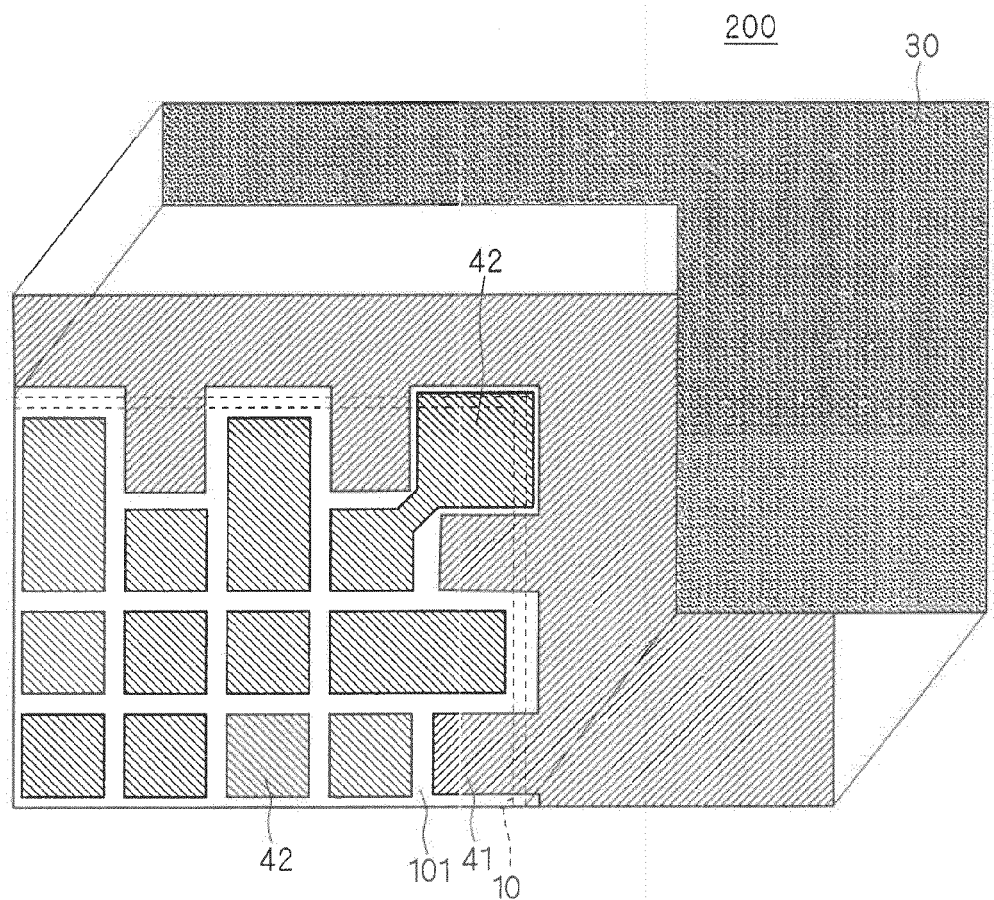
FIG. 9 is a plan view of the power semiconductor device according to the second embodiment.

FIG. 9 shows the state in which the gate pad 11 and the gate finger electrode 12 are omitted from the part shown in FIG. 2 and FIG. 3, and the field oxide film 30 corresponding to the lower layer of the gate pad 11 and the gate finger electrode 12 is moved obliquely upward.

As shown in FIG. 9, the P-type first well region 41 is formed within the surface of the SiC semiconductor layer 101 positioned in the part as the lower layer of the field oxide film 30, and a plurality of second well regions 42 are formed within the surface of the SiC semiconductor layer 101 so as to correspond to the respective cells of the MOSFET.

With reference to FIG. 9, parts of the first well region 41 extend so as to project from the formation region of the field oxide film 30, a part of the second well region 42 in proximity to the formation region of the field oxide film 30 extends so as to be sandwiched between the projections of the first well region 41, and the projections of the first well region 41 and the second well regions 42 are alternately provided in the vicinity of the field oxide film 30. Further, in the corner portion of the first well region 41, that is, in the part where the gate pad 11 intersects with the gate finger electrode 12 (see the region BC1 of FIG. 1), the second well region 42 is formed so as to be in proximity to the field oxide film 30, and the second well region 42 is configured so as to be connected to the second well region 42 to which a part thereof is adjacent and be also electrically connected to the adjacent second well region 42.

Figure 10:
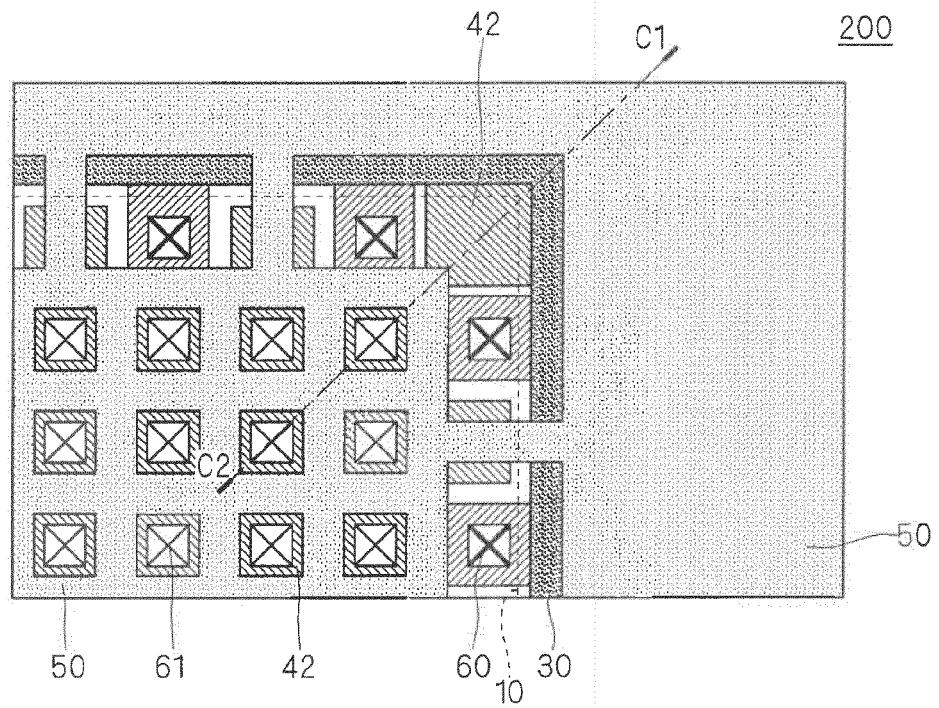
FIG. 10 is a plan view of the power semiconductor device according to the second embodiment.

FIG. 10 is a plan view showing the gate electrode 50 provided above the first well region 41 and the second well regions 42 shown in FIG. 9. With reference to FIG. 10, the gate electrode 50 is provided so as to be located within the formation region of the field oxide film 30 in the region that corresponds to the region below the gate pad 11 (FIG. 2) and the gate finger electrode 12 (FIG. 2), and is provided so as to surround the outer perimeter of each source contact hole 61 in the formation region of the MOSFET cell below the source electrode 10. Further, the portion of the gate electrode 50 below the gate pad 11 (FIG. 2) and the gate finger electrode 12 (FIG. 2) and the portion of the gate electrode 50 below the source electrode 10 are configured so as to be connected to each other through the region in which the well contact hole 60 is not provided.

In FIG. 10, a line C1-C2 indicates the cut line extending from the region including the cell region of the MOSFET to the region including the gate pad 11 of FIG. 2, which is shown as the line passing through the corner portion of the first well region 41. Note that the corner portion may partially have an angle close to 180 degrees in some cases when being configured to have a curvature, which is referred to as a corner portion having an angle less than 180 degrees.

With reference to FIG. 10, the gate electrode 50 is not provided in the corner portion, and the second well region 42 extends up to the portion below the field oxide film 30 in the region in the vicinity of the cornet portion where the gate insulating film is provided. Note that the second well region 42 is separated from the first well region 41 below the field oxide film 30 by the N⁻ drain layer 101.

Figure 11:
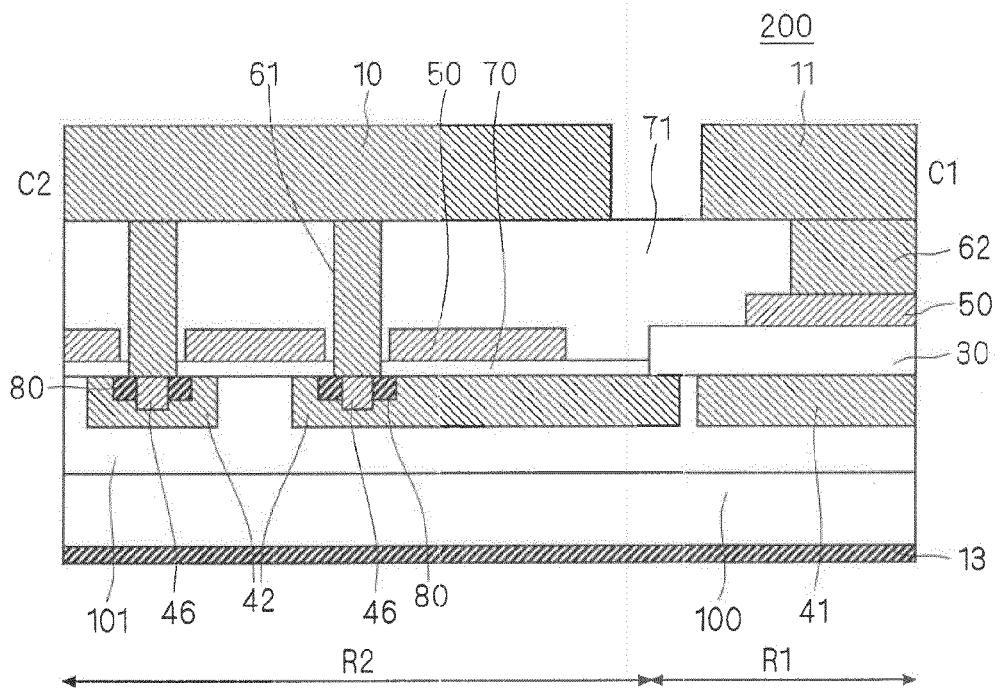
FIG. 11 is a vertical cross-sectional view of the power semiconductor device, which is taken along a line C1-C2 of FIG. 10.

FIG. 11 is a vertical cross-sectional view taken along the line C1-C2 of FIG. 10. Note that the same constituent elements as those of the power semiconductor device 100 shown in FIG. 7 and FIG. 8 are denoted by the same reference numerals, and redundant descriptions will be omitted.

As shown in FIG. 11, the second well region 42 is close to the corner portion of the first well region 41, the first well region 41 is located within the formation region of the field oxide film 30, and the gate electrode 50 is located within the formation region of the field oxide film 30 as well. For this reason, the configuration is not made such that the gate electrode 50 is disposed above the first well region 41 to be opposed thereto through only the gate insulating film 70, which prevents the dielectric breakdown of the gate insulating film 70.

In the power semiconductor device 200 according to the present embodiment described above, the configuration is not made such that the first well region 41, whose potential rises in a case where a voltage is applied so as to switch the MOSFET cells from the ON state to the OFF state, and the gate electrode 50, whose potential becomes substantially 0 V when the MOSFET cells are switched from the ON state to the OFF state, are opposed to each through only the gate insulating film 70. This results in a reduction of the possibility that the dielectric breakdown of the gate insulating film 70 may occur.

Further, as described in the first embodiment, the drain voltage is directly applied to the gate insulating film 70 if the value of the distance d between the first well region 41 and the second well region 42 is excessively large. However, the second well region 42 is provided so as to be in proximity to the first well region 41 in the region in the vicinity of the corner portion of the first well region 41, and thus it is expected to achieve an effect of preventing dielectric breakdown of the gate insulating film 70.

As described above, even in a case where the power semiconductor device 200 according to the present embodiment is driven at high speed, an electric field of large strength is prevented from being applied to the gate insulating film, which inhibits the dielectric breakdown of the gate insulating film. This enables a higher-speed switching operation.

Third Embodiment

A third embodiment of the present invention corresponds to a modified example of the first embodiment, which is characterized in that the configuration of the corner portion of FIG. 4 is changed. Hereinafter, characteristics of a power semiconductor device 300 according to the present embodiment will be described with reference to the figures.

FIG. 12 shows the state in which the source electrode 10, the gate pad 11 and the gate finger electrode 12 are omitted from the part shown in FIG. 2 and FIG. 3, and the field oxide film 30 corresponding to the lower layer of the gate pad 11 and the gate finger electrode 12 is moved obliquely upward.

As shown in FIG. 12, the P-type first well region 41 is formed within the surface of the SiC semiconductor layer 101 positioned in the part as the lower layer of the field oxide film 30, and a plurality of second well regions 42 are formed within the surface of the SiC semiconductor layer 101 so as to correspond to the respective cells of the MOSFET.

With reference to FIG. 12, parts of the first well region 41 extend so as to project from the formation region of the field oxide film 30, parts of the second well regions 42 in proximity to the formation region of the field oxide film 30 extend so as to be sandwiched between the projections of the first well region 41, and the projections of the first well region 41 and the second well regions 42 are alternately provided in the vicinity of the field oxide film 30. Further, in the part where the gate pad 11 intersects with the gate finger electrode 12 (see the region BC1 of FIG. 1), the first well region 41 is configured so as to project toward the cell region side of the MOSFET and have no corner portion as shown in FIG. 9.

FIG. 13 is a plan view showing the gate electrode 50 provided above the first well region 41 and the second well regions 42 shown in FIG. 12. With reference to FIG. 13, the gate electrode 50 is provided so as to be located within the formation region of the field oxide film 30 in the region that corresponds to the region below the gate pad 11 (FIG. 2) and the gate finger electrode 12 (FIG. 2), and is provided so as to surround the outer perimeter of each source contact hole 61 in the formation region of the MOSFET cell below the source electrode 10. Further, the portion of the gate electrode 50 below the gate pad 11 (FIG. 2) and the gate finger electrode 12 (FIG. 2) and the portion of the gate electrode 50 below the source electrode 10 are configured so as to be connected to each other through the region in which the well contact hole 60 is not provided.

In FIG. 13, a line D1-D2 indicates the cut line extending from the region including the cell region of the MOSFET to the region including the gate pad 11 of FIG. 2.

FIG. 14 is a vertical cross-sectional view taken along the line D1-D2 of FIG. 13. Note that the same constituent elements as those of the power semiconductor device 100 shown in FIG. 7 and FIG. 8 are denoted by the same reference numerals, and redundant descriptions will be omitted.

As shown in FIG. 14, though the first well region 41 projects from the formation region of the field oxide film 30 and is close to the second well region 42, the gate electrode 50 is located within the formation region of the field oxide film 30. For this reason, the configuration is not made such that the gate electrode 50 is disposed above the first well region 41 to be opposed thereto through only the gate insulating film 70.

As described above, in the power semiconductor device 300 according to the present embodiment, though the first well region 41 projects from the formation region of the field oxide film 30 and is adjacent to the second well region 42, the gate electrode 50 is not formed above the projection of the first well region 41. Accordingly, a high voltage is not applied to the gate insulating film 70 in the corner portion, which results in a reduction of the possibility that the dielectric breakdown of the gate insulating film 70 may occur.

Fourth Embodiment

A fourth embodiment of the present invention corresponds to a modified example of the first embodiment, which is characterized in that even in a case where the arrangement pattern of the second well regions 42 is more simplified, the possibility that dielectric breakdown of the gate insulating film 70 may occur is reduced unless the gate electrode 50 is provided in the corner portion of the first well region 41.

Hereinafter, the characteristics of the power semiconductor device 400 according to the present embodiment will be described with reference to the figures.

Figure 15:
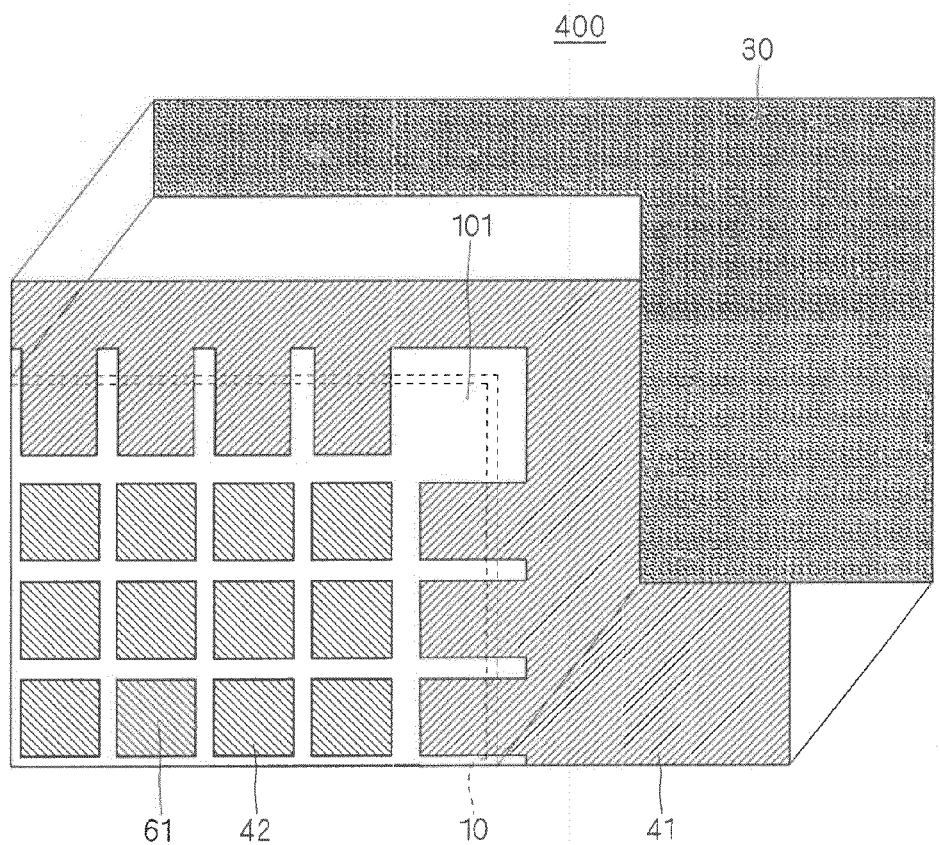
FIG. 15 is a plan view of the power semiconductor device according to the fourth embodiment.

FIG. 15 shows the state in which the gate pad 11 and the gate finger electrode 12 are omitted from the part shown in FIG. 2 and FIG. 3, and the field oxide film 30 corresponding to the lower layer of the gate pad 11 and the gate finger electrode 12 is moved obliquely upward.

As shown in FIG. 15, the P-type first well region 41 is formed within the surface of the SiC semiconductor layer 101 positioned in the part as the lower layer of the field oxide film 30 (not shown), and a plurality of second well regions 42 are formed within the surface of the SiC semiconductor layer 101 so as to correspond to the respective cells of the MOSFET.

With reference to FIG. 15, parts of the first well region 41 extend so as to project from the formation region of the field oxide film 30, the second well region 42 or the like is not located between the arranged projections thereof, and the second well regions 42 are provided in the region defined by the arrangement of the projections of the first well region 41.

Further, in the corner portion of the first well region 41, that is, in the part where the gate pad 11 intersects with the gate finger electrode 12 (see the region BC1 of FIG. 1), the projection of the first well region 41 and the second well region 42 are not formed.

Figure 16:
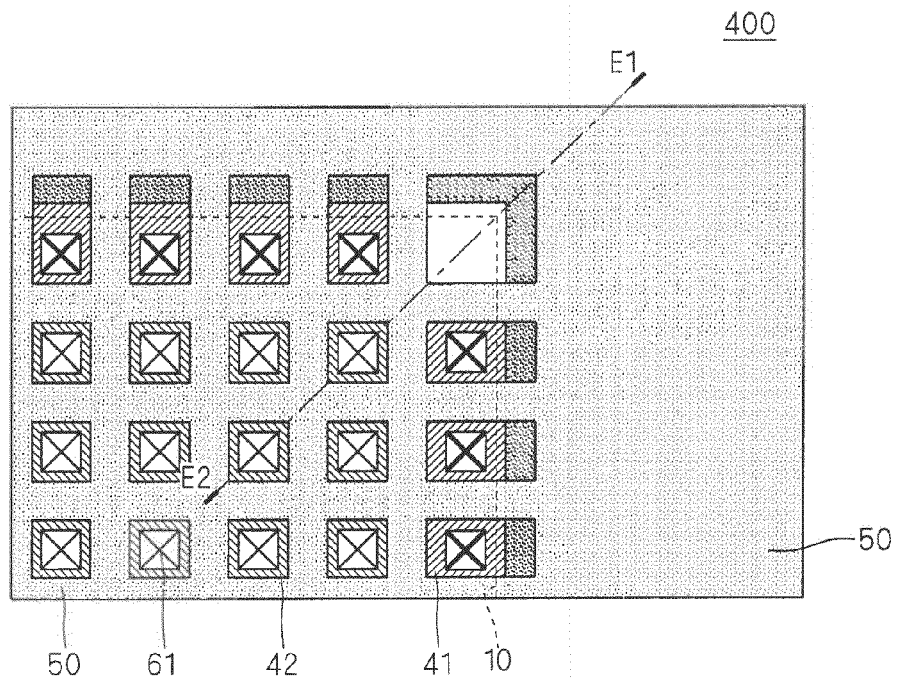
FIG. 16 is a plan view of the power semiconductor device according to the fourth embodiment.

FIG. 16 is a plan view showing the gate electrode 50 provided above the first well region 41 and the second well regions 42 shown in FIG. 15. With reference to FIG. 16, the gate electrode 50 is provided so as to be located within the formation region of the field oxide film 30 in the region that corresponds to the region below the gate pad 11 (FIG. 2) and the gate finger electrode 12 (FIG. 2), and is provided so as to surround the outer perimeter of each source contact hole 61 in the formation region of the MOSFET cell below the source electrode 10. Further, the portion of the gate electrode 50 below the gate pad 11 (FIG. 2) and the gate finger electrode 12 (FIG. 2) and the portion of the gate electrode 50 below the source electrode 10 are configured so as to be connected to each other through the region in which the well contact hole 60 is not provided.

In FIG. 16, a line E1-E2 indicates the cut line extending from the region including the cell region of the MOSFET to the region including the gate pad 11 of FIG. 2, which is shown as the line passing through the corner portion of the first well region 41. Note that the corner portion may partially have an angle close to 180 degrees in some cases when being configured to have a curvature, which is referred to as a corner portion having an angle less than 180 degrees.

As shown in FIG. 16, the projection of the first well region 41 and the second well region 42 are not provided, and even the gate electrode 50 is not provided in the corner portion.

Figure 17:
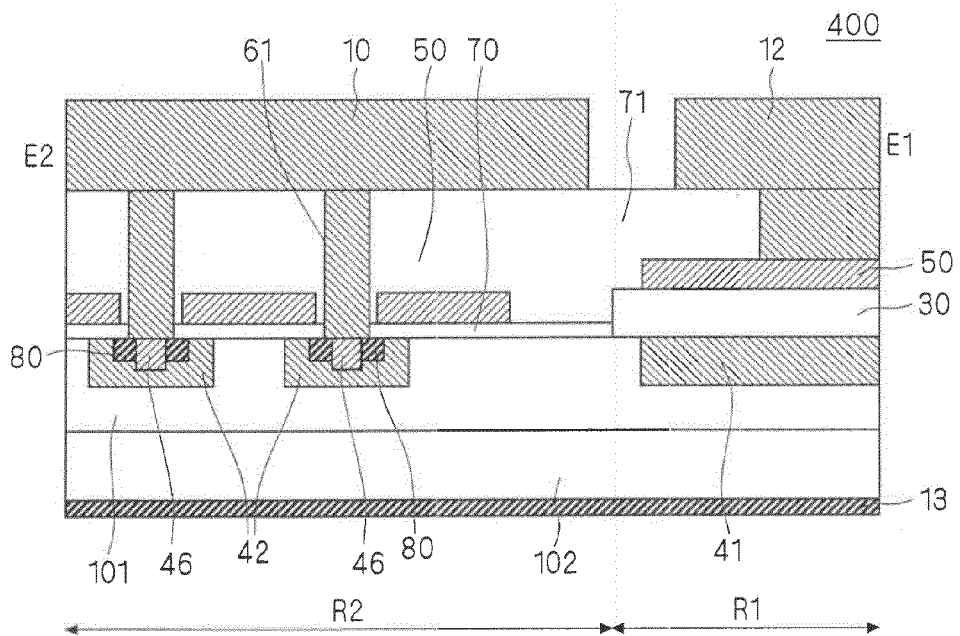
FIG. 17 is a vertical cross-sectional view of the power semiconductor device, which is taken along a line E1-E2 of FIG. 16.

FIG. 17 is a vertical cross-sectional view taken along the line E1-E2 of FIG. 16. Note that the same constituent elements as those of the power semiconductor device 100 shown in FIG. 7 and FIG. 8 are denoted by the same reference numerals, and redundant descriptions will be omitted.

As shown in FIG. 17, the first well region 41 and the gate electrode 50 are located within the formation region of the field oxide film 30, and thus the configuration is not made such that the gate electrode 50 is disposed above the first well region 41 to be opposed thereto through only the gate insulating film 70.

As described above, in the power semiconductor device 400 according to the present embodiment, the arrangement pattern of the second well regions 42 is simple, and the first well region 41 and the second well region 42 are not provided in the corner portion of the first well region 41. However, a high voltage is not applied to the gate insulating film 70 in the corner portion by not providing the gate electrode 50 in the corner portion, leading to a reduction in possibility that dielectric breakdown may occur in the gate insulating film 70. Accordingly, the effect of improving breakdown voltage is achieved.

Fifth Embodiment

Figure 18:
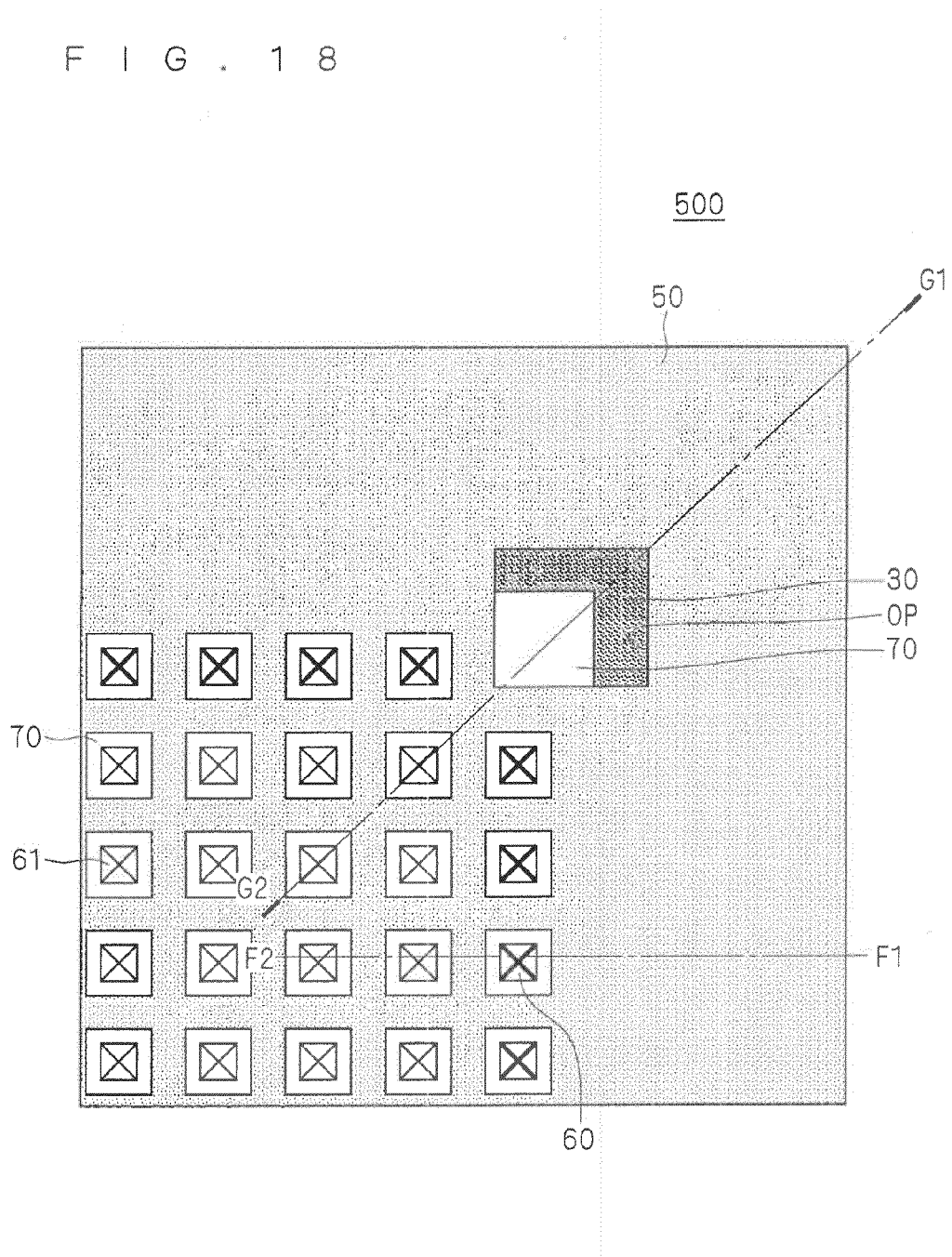
FIG. 18 is a plan view of the power semiconductor device according to the fifth embodiment.

FIG. 18 is a plan view showing the plane pattern of the gate electrode 50 of a power semiconductor device 500 according to a fifth embodiment, and the arrangement patterns of the well contact holes 60 and the source contact holes 61 are similar to those of the power semiconductor device 400 shown in FIG. 16. Here, the gate pad 11, the gate finger electrode 12 and the like of the upper layer are omitted.

FIG. 18 is largely different from FIG. 16 in that an opening OP of the gate electrode 50 in the vicinity of the corner portion of the first well region 41 is larger and the bonding portion between the gate insulating film 70 and the field oxide film 30 is exposed, and that the part other than the opening OP and the openings on the outer perimeter of each source contact hole 61 and each well contact hole 60 is entirely covered with the gate electrode 50.

Figure 19:
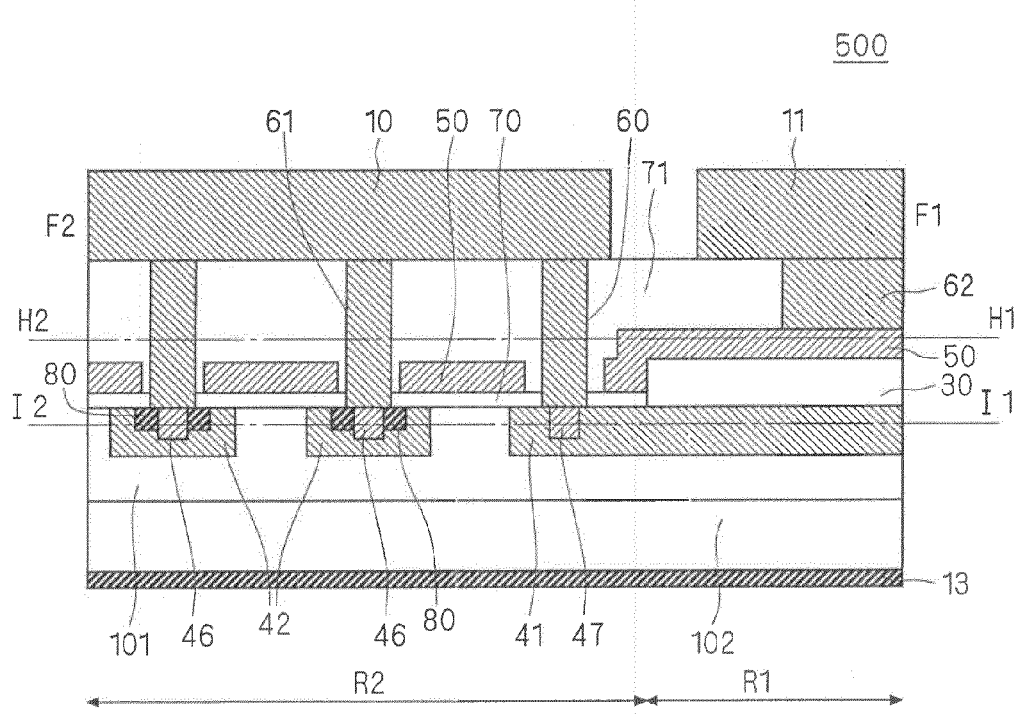
FIG. 19 is a vertical cross-sectional view of the power semiconductor device, which is taken along a line F1-F2 of FIG. 18.

FIG. 19 is a vertical cross-sectional view taken along a line F1-F2 of FIG. 18. Note that the same constituent elements as those of the power semiconductor device 100 shown in FIG. 7 and FIG. 8 are denoted by the same reference numerals, and redundant descriptions will be omitted.

With reference to FIG. 19, differences from the power semiconductor device 100 shown in FIG. 7 and FIG. 8 and the power semiconductor device 200 shown in FIG. 11 are that the gate electrode 50 is provided from above the field oxide film 30 to above the gate oxide film 70, and that first well region 41 is located also below the boundary surface between the end of the gate insulating film 70 and the end of the field oxide film 30.

Figure 20:
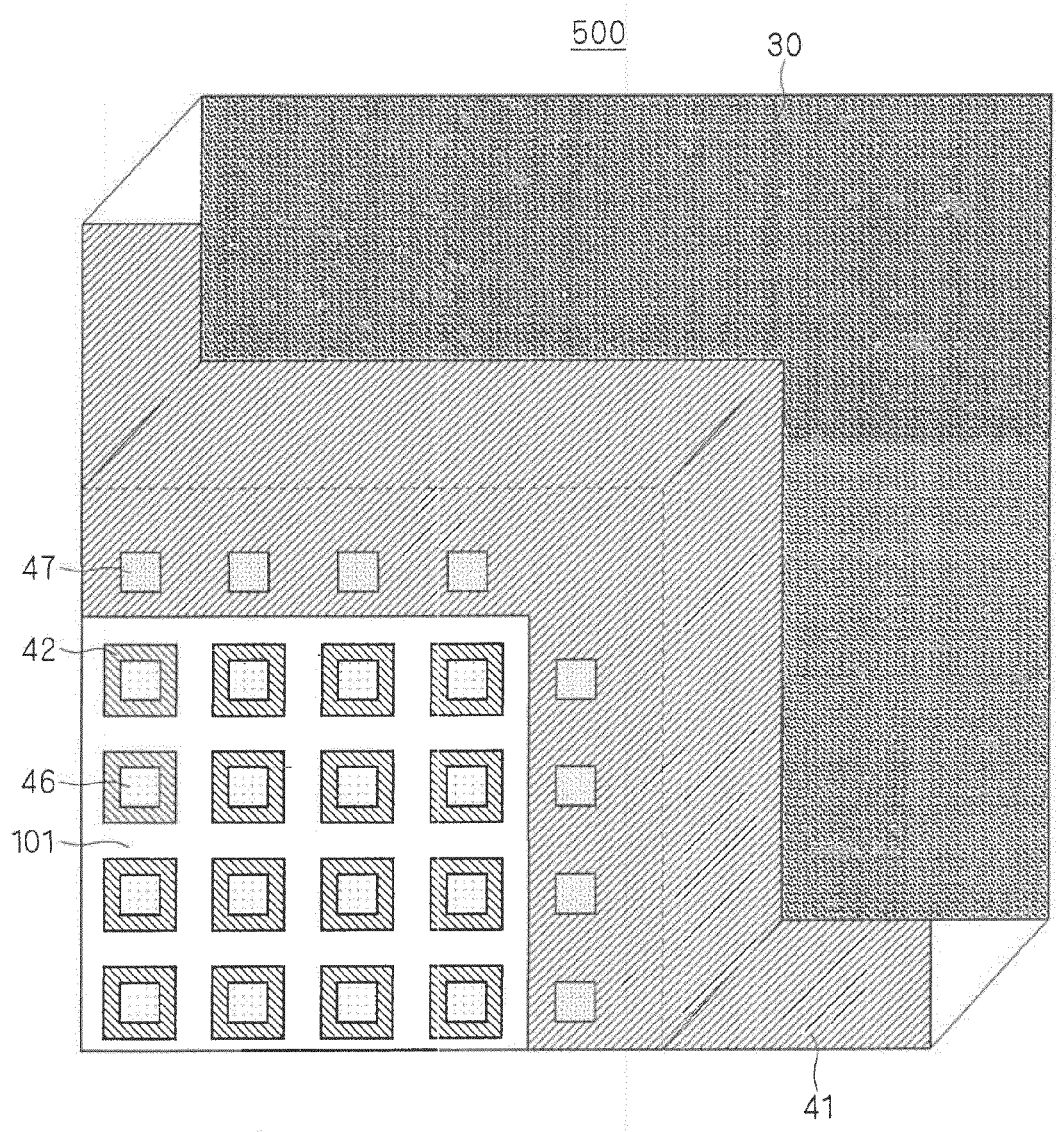
FIG. 20 is a plan view of the power semiconductor device according to the fifth embodiment.

Note that the cross-sectional view in a horizontal direction that is taken along a line H1-H2 of FIG. 19 corresponds to the plan view shown in FIG. 18, and FIG. 20 is the cross-sectional view in the horizontal direction that is taken along a line 11-12 of FIG. 19.

FIG. 20 shows the state in which the field oxide film 30 to be disposed on the first well region 41 is moved obliquely upward and, as shown in FIG. 20, the first well region 41 is formed so as to extend from the formation region of the field oxide film 30 and be in proximity to the formation region of the MOSFET cells.

A plurality of P-type contact regions 47 are each formed so as to surround the formation region of the MOSFET cell within the surface of the first well region 41, and a plurality of second well regions 42 are formed in matrix within the surface of the formation region of the MOSFET cell. In addition, the P-type contact region 46 is formed in the center portion of each second well region 42.

Further, in FIG. 18, a line G1-G2 indicates the cut line that extends from the region including the cell region of the MOSFET to the region including the gate pad 11 of FIG. 2, which is shown as the line passing through the corner portion (FIG. 20) of the first well region 41.

FIG. 21 is a vertical cross-sectional view taken along a line G1-G2 of FIG. 18. Note that the same constituent elements as those of the power semiconductor device 100 shown in FIG. 7 and FIG. 8 are denoted by the same reference numerals, and redundant descriptions will be omitted.

As shown in FIG. 21, the first well region 41 extends from the first region R1 to the second region R2, and the boundary surface between the end of the gate insulating film 70 and the end of the field oxide film 30 is located thereon.

Next, a difference from the cross-sectional view taken along a line F1-F2 shown in FIG. 19 will be described. With reference to FIG. 19, the bonding portion between the field oxide film 30 and the gate insulating film 70 is located between the gate electrode 50 and the first well region 41, whereas in FIG. 21, the gate electrode 50 is not located above the bonding portion between the field oxide film 30 and the gate insulating film 70.

Here, a solid angle in a case where the first region R1 is viewed from the boundary surface between the field oxide film 30 and the gate insulating film 70 on the first well region 41 is $\pi$ when viewed from the straight line portion of the boundary surface, while the solid angle becomes larger than π when viewed from the corner portion of the boundary surface.

In a case where a voltage is applied such that the MOSFET cells are switched from the ON state to the OFF state, the displacement current that flows into the first well region 41 and then flows into the source contact hole 61 increases as the solid angle viewed from the boundary surface increases.

For this reason, a voltage rise of the first well region 41 becomes larger in the corner portion than the straight line portion. However, in the power semiconductor device 500 according to the present embodiment, as shown in FIG. 21, the gate electrode 50 is not located above the corner part of the boundary surface between the field oxide film 30 and the gate insulating film 70. Therefore, a possibility that dielectric breakdown of the gate insulating film 70 may occur is low even if a voltage rise of the first well region 41 is large.

While, in the straight line part of the boundary surface between the field oxide film 30 and the gate insulating film 70, the gate electrode 50 is located thereabove as shown in FIG. 19. However, a voltage rise of the first well region 41 is small, leading to a low possibility that dielectric breakdown of the gate insulating film 70 may occur.

As described above, in the power semiconductor device 500 according to the present embodiment, the arrangement patterns of the first well region 41 and the second well regions 42 are simple. However, a high voltage is not applied to the gate insulating film 70 in the corner part by avoiding the gate electrode 50 from being provided above the corner portion of the boundary surface of the field oxide film 30 and the gate insulating film 70, leading to a reduction in possibility that dielectric breakdown may occur in the gate insulating film 70. Accordingly, the effect of improving breakdown voltage is achieved.

Therefore, even in the case of high-speed driving, an electric field of large strength is prevented from being applied to the gate insulating film 70, which inhibits the dielectric breakdown of the gate insulating film. Accordingly, a higher-speed switching operation is achieved.

While the invention has been shown and described in detail, the foregoing description is in all aspects illustrative and not restrictive. It is therefore understood that numerous modifications and variations can be devised without departing from the scope of the invention.

For example, the first to fifth embodiments disclose the semiconductor devices including the MOSFET in which silicon carbide (SiC) is used as a semiconductor substrate material. However, the effects of the present invention do not depend on a substrate material and, even in a semiconductor device in which Si, GaN or the like is used as a substrate material of the MOSFET, similar effects may be expected.

Further, while the first to fifth embodiments disclose the cases where the semiconductor element is a vertical MOSFET, the above-mentioned effects of the present invention are obtained even with the configuration including the cell region of the IGBT by providing a $P^+$ collector layer between, for example, the $N^+$ drain layer 102 and the drain electrode 13 shown in FIG. 7.

Therefore, it can be said that the scope of the validity of the present invention pertains to the semiconductor devices as the switching elements having the MOS structure such as MOSFET and IGBT. In a case where a semiconductor device is a vertical MOSFET, the drain electrode and the source electrode correspond to the first electrode and the second electrode, respectively, and in a case where a semiconductor device is an IGBT, the collector electrode and the emitter electrode correspond to the first electrode and the second electrode, respectively.

Further, in the present invention, a semiconductor element having the MOS structure described in, for example, the first embodiment is defined as a "semiconductor device" in a narrow sense. Besides, a freewheel diode connected in anti-parallel to the semiconductor element and power modules such as an inverter module that is mounted in a lead frame together with, for example, a control circuit for generating and applying a gate voltage of the semiconductor element and is sealed therewith are also defined as "semiconductor devices" in a broad sense.

INDUSTRIAL APPLICABILITY

The present invention is preferably applicable to a power converter such as an inverter.

The invention claimed is:
1. A power semiconductor device, comprising:
a first-conductivity-type semiconductor substrate including a first main surface and a second main surface opposed to each other;
a second-conductivity-type first well region located in a part of a surface of the first main surface of said first-conductivity-type semiconductor substrate;
a second-conductivity-type second well region located in a part of the surface of the first main surface of said first-conductivity-type semiconductor substrate and having a smaller area compared with said first well region when viewed from an upper surface;
a gate insulating film located on a surface of said second well region;
a field oxide film located in a part of a surface of said first well region and having a larger film thickness compared with said gate insulating film;
a source electrode electrically connecting said first well region and said second well region;
a gate electrode located on said gate insulating film and said field oxide film so as to be in contact therewith in a continuous manner;
a gate pad located above said first well region and electrically connected to said gate electrode; and
a drain electrode located on the second main surface of said semiconductor substrate,
wherein an outer boundary of said first well region is located inside an outer perimeter of said field oxide film in a vicinity of a bonding portion between said gate insulating film and said field oxide film in all locations in which said gate electrode located on an upper surface of said field oxide film while being in contact with said field oxide film extends beyond said field oxide film.
2. The power semiconductor device according to claim 1, wherein a contact hole electrically connecting said first well region and said source electrode is located in a location in which said first well region is located outside the outer perimeter of said field oxide film.
3. A power semiconductor device, comprising:
a first-conductivity-type semiconductor substrate including a first main surface and a second main surface opposed to each other;
a second-conductivity-type first well region located in a part of a surface of the first main surface of said first-conductivity-type semiconductor substrate;
a second-conductivity-type second well region located in a part of the surface of the first main surface of said first-conductivity-type semiconductor substrate and having a smaller area compared with said first well region when viewed from an upper surface;

a gate insulating film located on a surface of said second well region;

a field oxide film located in a part of a surface of said first well region and having a larger film thickness compared with said gate insulating film;

a source electrode electrically connecting said first well region and said second well region;

a gate electrode located on said gate insulating film and said field oxide film so as to be in contact therewith in a continuous manner;

a gate pad located above said first well region and electrically connected to said gate electrode; and a drain electrode located on the second main surface of said semiconductor substrate, wherein:

said first well region is located directly below a bonding portion between said gate insulating film and said field oxide film in a location in which said gate electrode located on an upper surface of said field oxide film while being in contact with said field oxide film extends beyond said field oxide film; and said first well region extends beyond said field oxide film in a vicinity of the bonding portion between said gate insulating film and said field oxide film in a location in which said gate electrode is located inside an outer perimeter of said field oxide film.

4. The power semiconductor device according to claim 3, wherein a contact hole electrically connecting said first well region and said source electrode is located in a location in which said first well region is located outside the outer perimeter of said field oxide film.

5. A power semiconductor device, comprising:
a first-conductivity-type semiconductor substrate including a first main surface and a second main surface opposed to each other;

a second-conductivity-type first well region located in a part of a surface of the first main surface of said first-conductivity-type semiconductor substrate;

a second-conductivity-type second well region located in a part of the surface of the first main surface of said first-conductivity-type semiconductor substrate and having a smaller area compared with said first well region when viewed from an upper surface;

a gate insulating film located on a surface of said second well region;

a field oxide film located in a part of a surface of said first well region and having a larger film thickness compared with said gate insulating film;

a source electrode electrically connecting said first well region and said second well region;

a gate electrode located on said gate insulating film and said field oxide film so as to be in contact therewith in a continuous manner;

a gate pad located above said first well region and electrically connected to said gate electrode; and a drain electrode located on the second main surface of said semiconductor substrate, wherein a structure in which an outer boundary of said first well region is located inside an outer perimeter of said field oxide film in a vicinity of a bonding portion between said gate insulating film and said field oxide film in a location in which said gate electrode located on an upper surface of said field oxide film while being in contact with said field oxide film extends beyond said field oxide film and a structure in which said first well region extends beyond said field oxide film in a vicinity of the bonding portion between said gate insulating film and said field oxide film in a location in which said gate electrode is located inside the outer perimeter of said field oxide film are alternately located along a boundary of the bonding portion between said gate insulating film and said field oxide film.

6. The power semiconductor device according to claim 5, wherein a contact hole electrically connecting said first well region and said source electrode is located in a location in which said first well region is located outside the outer perimeter of said field oxide film.

7. A power semiconductor device, comprising:
a first-conductivity-type semiconductor substrate including a first main surface and a second main surface opposed to each other;

a second-conductivity-type first well region located in a part of a surface of the first main surface of said first-conductivity-type semiconductor substrate;

a second-conductivity-type second well region located in a part of the surface of the first main surface of said first-conductivity-type semiconductor substrate and having a smaller area compared with said first well region when viewed from an upper surface;

a gate insulating film located on a surface of said second well region;

a field oxide film located in a part of a surface of said first well region and having a larger film thickness compared with said gate insulating film;

a source electrode electrically connecting said first well region and said second well region;

a gate electrode located on said gate insulating film and said field oxide film so as to be in contact therewith in a continuous manner;

a gate pad located above said first well region and electrically connected to said gate electrode; and a drain electrode located on the second main surface of said semiconductor substrate, wherein said second well region is located, in a vicinity of a bonding portion between said gate insulating film and said field oxide film in a location in which said gate electrode located on an upper surface of said field oxide film while being in contact with said field oxide film extends beyond said field oxide film, directly below said bonding portion.

8. The power semiconductor device according to claim 7, wherein a contact hole electrically connecting said first well region and said source electrode is located in a location in which said first well region is located outside the outer perimeter of said field oxide film.

9. A power semiconductor device, comprising:
a first-conductivity-type semiconductor substrate including a first main surface and a second main surface opposed to each other;

a second-conductivity-type first well region located in a part of a surface of the first main surface of said first-conductivity-type semiconductor substrate;

a second-conductivity-type second well region located in a part of the surface of the first main surface of said first-conductivity-type semiconductor substrate and having a smaller area compared with said first well region when viewed from an upper surface;

a gate insulating film located on a surface of said second well region;

a field oxide film located in a part of a surface of said first well region and having a larger film thickness compared with said gate insulating film;

a source electrode electrically connecting said first well region and said second well region;

a gate electrode located on said gate insulating film and said field oxide film so as to be in contact therewith in a continuous manner;

a gate pad located above said first well region and electrically connected to said gate electrode; and a drain electrode located on the second main surface of said semiconductor substrate, wherein, in a corner portion where a region in which said gate insulating film is located is less than 180 degrees when viewed from above on an outer perimeter of a boundary between said field oxide film and said gate insulating film, an outer boundary of said first well region is located inside an outer perimeter of said field oxide film in a vicinity of a bonding portion between said gate insulating film and said field oxide film in a location in which said gate electrode located on an upper surface of said field oxide film while being in contact with said field oxide film extends beyond said field oxide film.

10. The power semiconductor device according to claim 9, wherein a contact hole electrically connecting said first well region and said source electrode is located in a location in which said first well region is located outside the outer perimeter of said field oxide film.

* * * * *